(12) United States Patent
Jauster et al.

(10) Patent No.: US 8,139,948 B2
(45) Date of Patent: Mar. 20, 2012

(54) PROCESS AND SYSTEM FOR PROVIDING ELECTRICAL ENERGY TO A SHIELDED MEDICAL IMAGING SUITE

(75) Inventors: Ralf Jauster, Stolberg (DE); Paul Coenen, Titz-Rödingen (DE); Michael Friebe, Recklinghausen (DE)

(73) Assignee: ACIST Medical Systems, Inc., Eden Prairie, MN (US)

( * ) Notice: Subject to any disclaimer, the term of this patent is extended or adjusted under 35 U.S.C. 154(b) by 616 days.

(21) Appl. No.: 11/423,570

(22) Filed: Jun. 12, 2006

(65) Prior Publication Data

US 2007/0285021 A1 Dec. 13, 2007

(51) Int. Cl.
*H04B 10/00* (2006.01)
(52) U.S. Cl. ........ 398/162; 398/159; 398/140; 398/135; 398/171
(58) Field of Classification Search .................... 398/39, 398/159, 116, 162, 158, 140, 141, 171, 135, 398/137; 315/85
See application file for complete search history.

(56) References Cited

U.S. PATENT DOCUMENTS

| | | | | |
|---|---|---|---|---|
| 4,118,249 A * | 10/1978 | Graven et al. | ................. | 136/246 |
| 4,119,948 A * | 10/1978 | Ward et al. | ................. | 340/870.02 |
| 4,695,674 A * | 9/1987 | Bar-on | ................. | 136/256 |
| 4,737,712 A | 4/1988 | Stormont et al. | | |
| 5,162,935 A * | 11/1992 | Nelson | ................. | 398/107 |
| 6,188,494 B1 * | 2/2001 | Minteer | ................. | 398/135 |
| 6,198,287 B1 | 3/2001 | Heiserholt et al. | | |
| RE37,602 E | 3/2002 | Uber, III et al. | | |
| 6,925,322 B2 * | 8/2005 | Helfer et al. | ................. | 600/423 |
| 7,002,131 B1 | 2/2006 | Lewis | | |
| 7,511,259 B2 * | 3/2009 | Nyffenegger et al. | ... | 250/227.11 |
| 7,512,434 B2 | 3/2009 | Staats et al. | | |
| 7,742,799 B2 * | 6/2010 | Mueller et al. | ................. | 600/410 |
| 7,939,792 B2 * | 5/2011 | Nyffenegger et al. | ... | 250/227.11 |
| 2001/0035752 A1 * | 11/2001 | Kormos et al. | ................. | 324/307 |
| 2002/0077560 A1 | 6/2002 | Kramer et al. | | |
| 2003/0050555 A1 * | 3/2003 | Critchlow et al. | ............ | 600/420 |
| 2003/0058502 A1 * | 3/2003 | Griffiths et al. | ................. | 359/152 |
| 2003/0204207 A1 * | 10/2003 | MacDonald et al. | ............. | 607/2 |
| 2004/0124838 A1 * | 7/2004 | Duerk et al. | .................. | 324/304 |

(Continued)

FOREIGN PATENT DOCUMENTS

DE 196 40 463 A1 10/1997

(Continued)

OTHER PUBLICATIONS

The International Search Report and Written Opinion for International Appl. No. PCT/US2007/070479, mailed Dec. 10, 2007.
Werthen et al., "Electrically Isolated Power Delivery for MRI Applications," *Proc. Intl. Soc. Mag. Reson. Med.*, May 2006, p. 1353.

(Continued)

*Primary Examiner* — Kenneth N Vanderpuye
*Assistant Examiner* — Hibret Woldekidan
(74) *Attorney, Agent, or Firm* — Fredrikson & Byron, P.A.

(57) ABSTRACT

A process and system are disclosed for supplying electrical energy to a device located in a room housing an imaging system (such as an MRI system, for example), wherein the room is shielded from external electromagnetic fields. Certain embodiments of the present invention provide systems and processes for emitting electromagnetic radiation in the wavelength range of the light spectrum from at least one light emission device. Embodiments of the present invention further provide a process and system for transforming the electromagnetic radiation into electrical energy using at least one transducer device located in the room, and supplying the electrical energy to the device so as to minimize interfering electromagnetic fields within the room.

18 Claims, 2 Drawing Sheets

U.S. PATENT DOCUMENTS

| | | | |
|---|---|---|---|
| 2004/0143185 A1* | 7/2004 | Zatezalo et al. | 600/432 |
| 2005/0201432 A1* | 9/2005 | Uehara et al. | 372/30 |
| 2005/0203378 A1* | 9/2005 | Helfer et al. | 600/410 |
| 2005/0226625 A1* | 10/2005 | Wake et al. | 398/115 |
| 2006/0066311 A1* | 3/2006 | Koste et al. | 324/322 |
| 2006/0217602 A1* | 9/2006 | Abul-Haj et al. | 600/316 |
| 2007/0127797 A1* | 6/2007 | Angelos et al. | 382/128 |
| 2008/0181271 A1* | 7/2008 | Hattori | 372/38.01 |

FOREIGN PATENT DOCUMENTS

| | | |
|---|---|---|
| WO | WO 01/92907 A2 | 12/2001 |

OTHER PUBLICATIONS

Weiss et al., "Optically Powered Sensor Technology," ISA Tech/Expo Technology Update, Instrument Society of America, vol. 1, No. PART 4, 1997, pp. 69-75.

Werthen et al., "Power over Fiber: A Review of Replacing Copper by Fiber in Critical Applications,", *Proceedings of SPIE*, vol. 5871, 2005, pp. 58710C-1-58710C-6.

Wu et al., "Watt Range Electrical Power Output Through Single Optical Fiber for Remote, Safe, Isolated Power Applications," *Proceedings of SPIE*, vol. 5871, 2005, pp. 58710E-1-58710E-10.

* cited by examiner

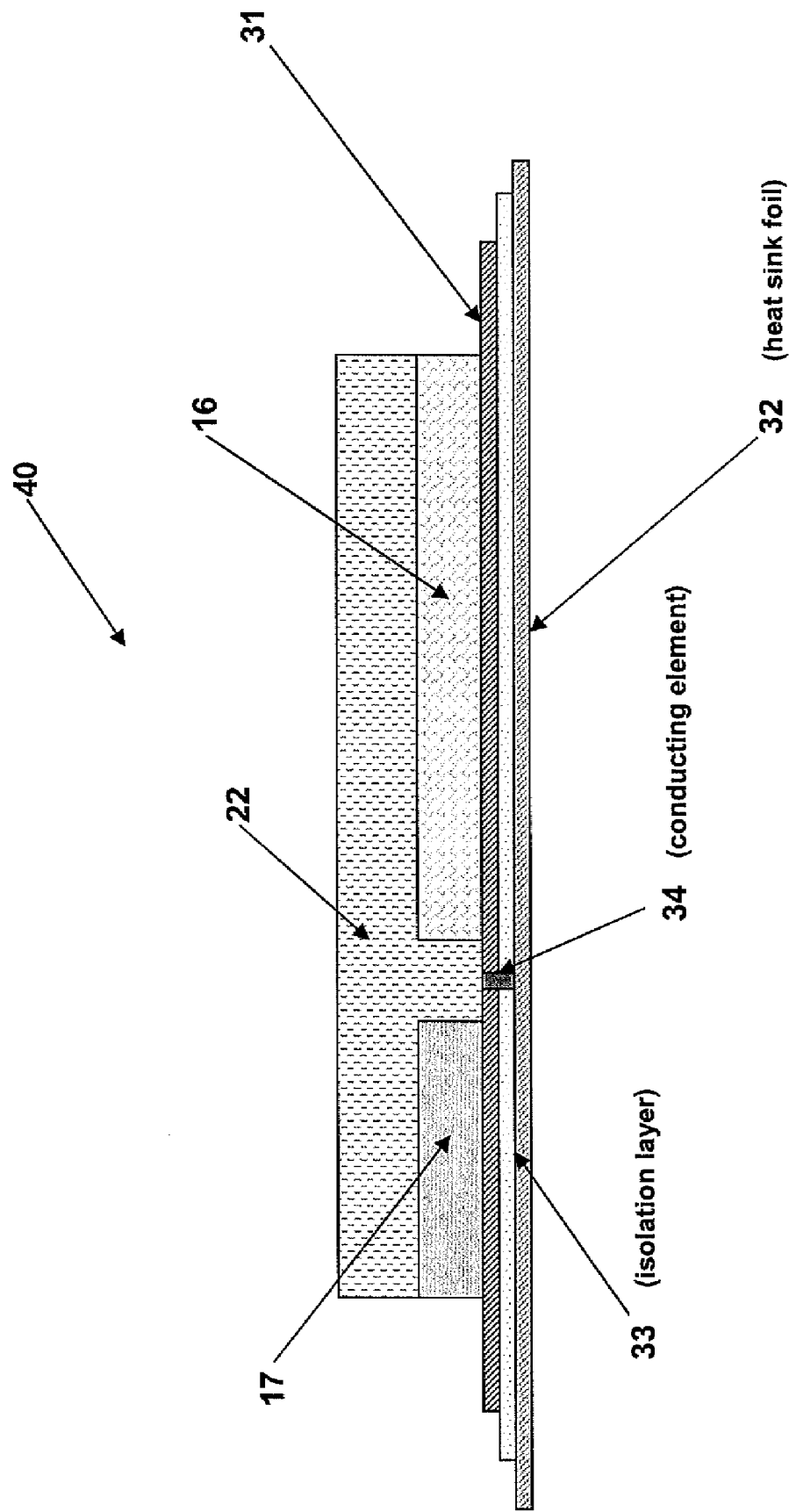

PROCESS AND SYSTEM FOR PROVIDING ELECTRICAL ENERGY TO A SHIELDED MEDICAL IMAGING SUITE

FIELD OF THE INVENTION

Embodiments of the present invention provide a process and system for supplying electrical energy to a device in an imaging room.

BACKGROUND OF THE INVENTION

Where rooms are shielded from potentially interfering electromagnetic (EM) fields, as is sometimes necessary in medical imaging suites (such as MRI imaging suites, for example), the transmission of electricity into such rooms can be problematic. For example, it is not possible to use standard electrical supply systems, such as an alternating current form, without special screening in the particularly sensitive area of the medical imaging device (such as MRI, for example) due to the generally large interference fields generated by such electrical supply systems. However, within a medical imaging suite, it is necessary that there is a dependable supply of electrical energy for devices located within the medical imaging suite.

One example of a device often utilized in an imaging suite (such as a shielded MRI room, for example) is a mobile injection system for dispensing contrast fluid to an individual prior to an imaging procedure. The administration and control of the injection system should preferably be undertaken in very close proximity to the individual (who is positioned within the MRI magnet coils, for example). Therefore, the length of any electrical cabling between the electrical supply (which necessarily located outside of the medical imaging room) and the injection system must extend between the medical imaging device (such as MRI) and the extents of the shielded room. An electrical supply cable of such length may result in unacceptable interference fields that adversely affect the quality of the images produced by the medical imaging system.

Therefore, existing devices (such as mobile injection devices) utilize battery sources for supplying direct electrical energy in direct current form. Such battery sources are located within the mobile injection system or in its immediate proximity. One disadvantage of this approach is that the battery must be changed and/or re-charged regularly thereby interfering with the operability of the medical imaging system.

In some other existing systems, a rechargeable accumulator is used instead of a battery. The use of a rechargeable accumulator, however, also requires regular maintenance. For example, the accumulator must be periodically recharged and/or replaced after a certain number of recharging cycles. Such maintenance delays, including the exchange and the associated "running in" of new accumulators, are likewise disadvantageous to the standard long-term operation of the medical imaging system. Furthermore, in existing systems, the malfunction of either a battery or an accumulator, for example, within the imaging suite may lead to potential sources of interference that may, in turn, adversely affect the operation of the imaging system (such as an MRI system, for example).

Thus, there exists a need for a system and process for supplying electrical energy to devices (such as mobile injection units) located within an imaging suite (such as a shielded MRI room, for example) wherein the system and process are operationally secure and require little or no maintenance. Furthermore, there is a need for such a system and process that supplies electrical energy to the medical imaging room (such as a room housing an MRI device) without generating electromagnetic (EM) fields that may interfere with the imaging capabilities of the imaging system.

BRIEF SUMMARY OF THE INVENTION

The needs outlined above are met by the present invention which, in various embodiments, provides a system that overcomes many of the technical problems discussed above, as well other technical problems, with regard to the supply of electrical energy to a device (such as, for example, mobile injection units, extravasation detection devices, and/or other devices located within a shielded imaging facility (such as an EM-shielded MRI suite)). Specifically, in one embodiment, a process is provided for providing electrical energy to a device located in an imaging room wherein the imaging room includes shielding against EM fields located outside the room. In one embodiment, the process comprises emitting electromagnetic radiation in the wave length range of the light spectrum from at one least one light emitting device, transforming the electromagnetic radiation into electrical energy using at least one transducer device located in the room, and directing the electrical energy to the device so as to minimize interfering magnetic fields in the room.

In some embodiments, the emitting step may further comprise emitting the electromagnetic radiation from outside the shielding of the room. For example, in some embodiments, the emitting step may further comprise emitting the electromagnetic radiation into the room through a viewing port defined in the shielding. In other embodiments, the emitting step may comprise emitting the electromagnetic radiation into the room using a transmitter fiber-optic cable.

In other embodiments, the process may further comprise transmitting a control signal from the transducer device to the light emitting device using a responder fiber-optic cable such that the emitting step is controlled from inside the room. In some embodiments, the control signal may comprise information corresponding to a light transmitting capability of the transmitter fiber-optic cable element.

Various embodiments of the present invention also provide a system for providing electrical energy to a device located in an imaging system room wherein the room includes shielding against EM fields located outside the room. In one embodiment, the system comprises a light emitting device for emitting electromagnetic radiation in the wave length range of the light spectrum and a transducer device located in the room for transforming the electromagnetic radiation into electrical energy. The transducer device is also configured to be capable of directing the electrical energy to the device so as to minimize interfering magnetic fields in the room.

In some embodiments, the light emitting device may further comprise a lighting element (such as a laser diode) that may be located outside the shielding of the room. Furthermore, the system may further comprise a transmitter fiber-optic cable including a first end connected to an outlet of the light emitting device and a second end connected to the transducer device for transmitting the electromagnetic radiation from the laser device to the transducer device. In some embodiments, the second end of the transmitter fiber-optic cable may be operably engaged with the transducer device using an optical connecting element.

In some embodiments, the transmitter fiber optic capable may be configured to be capable of transmitting a data stream. Other embodiments may further comprise a responder fiber-optic cable operably engaged between the photovoltaic device and the light emitting for transmitting a control signal from the photovoltaic device to the light emitting device such that the light emitting device is controllable from inside the room. According to some such embodiments, the responder fiber-optic cable may be configured to be capable of relaying to the light emitting device information corresponding to a light transmitting capability of the transmitter fiber-optic cable element and controlling the light emitting device to adjust the intensity of the electromagnetic radiation emitted thereby in response to the relayed transmitting capability of the transmitter fiber optic cable.

In some embodiments, the transducer device may comprise a photovoltaic element configured to be capable of converting the electromagnetic radiation into electrical energy. In some such embodiments, the photovoltaic element may be operably engaged with a planar metallic element via a heat conducting element. The planar metallic element may be configured to extend beyond the extent of the area of the photovoltaic element so as to be capable of dissipating heat generated by the photovoltaic element when transforming the electromagnetic radiation into electrical energy.

Thus, the systems and processes for providing electrical energy to a device located in an imaging system room (such as an MRI system room), as described in the embodiments of the present invention, provide many advantages that may include, but are not limited to: transmitting energy to a device in the form of electromagnetic radiation within the wavelength of the light spectrum so as to avoid the generation of electromagnetic fields that may interfere with the operation of an imaging device (such as an MRI system, for example) co-located with the device; eliminating and/or minimizing the need for EM shielding around electrical energy transmission cables within an imaging room; and generating the electromagnetic radiation in the light spectrum using a light-emitting device located outside a shielded imaging room so as to avoid the generation of interfering EM fields by the light-emitting device.

BRIEF DESCRIPTION OF THE SEVERAL VIEWS OF THE DRAWINGS

Figure 1:
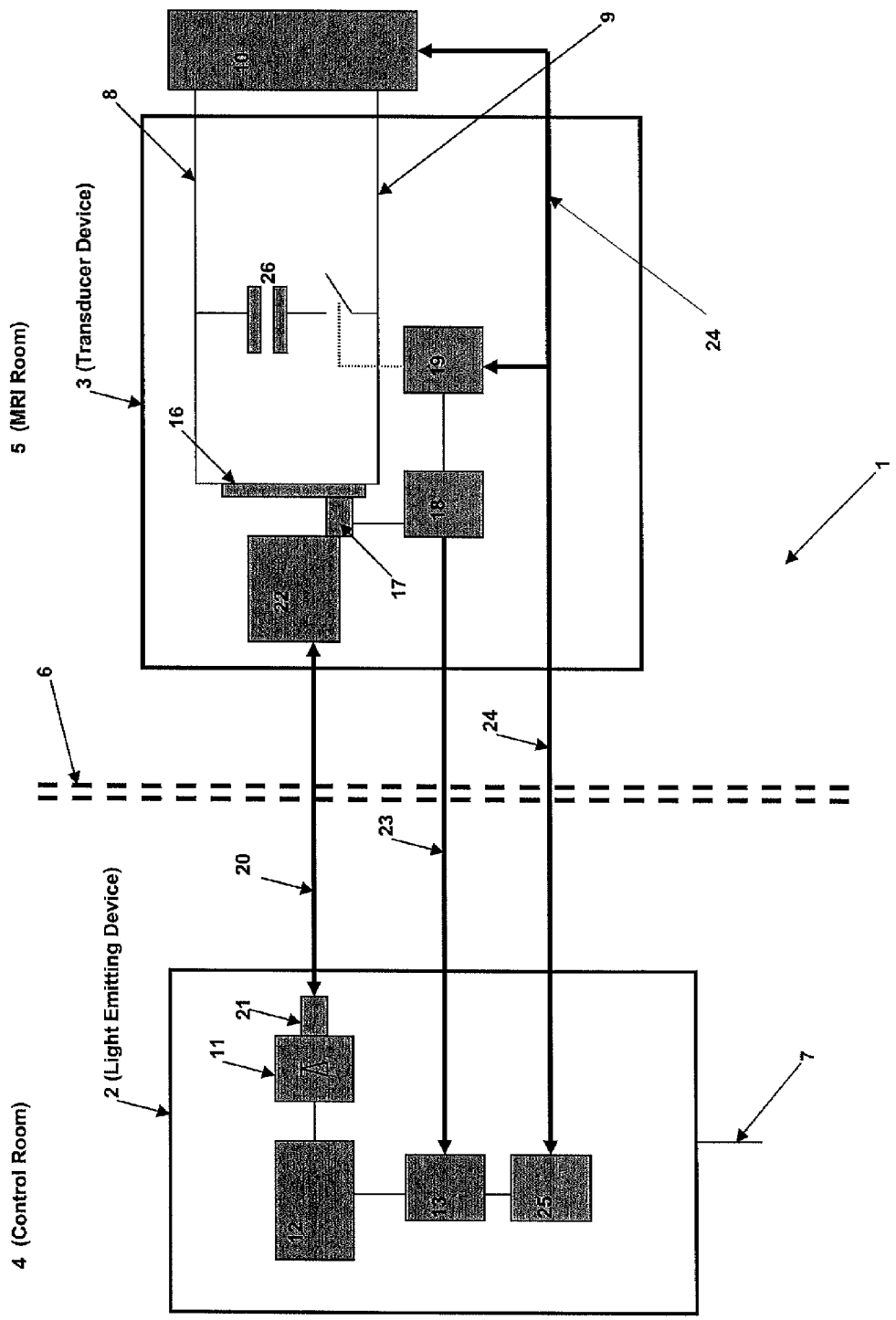

Having thus described the invention in general terms, reference will now be made to the accompanying drawings, which are not necessarily drawn to scale, and wherein:

FIG. 1 shows a schematic of a system and process for providing electrical energy from a light-emitting device to a transducer device according to one embodiment of the present invention.

FIG. 2 shows a schematic cross-section of a "sandwich" construction of the transducer device according to one embodiment of the present invention.

DETAILED DESCRIPTION OF THE INVENTION

The present inventions now will be described more fully hereinafter with reference to the accompanying drawings, in which some, but not all embodiments of the invention are shown. Indeed, these inventions may be embodied in many different forms and should not be construed as limited to the embodiments set forth herein; rather, these embodiments are provided so that this disclosure will satisfy applicable legal requirements. Like numbers refer to like elements throughout.

According to one embodiment, as shown in FIG. 1, the system 1 for the provision of electrical energy comprises a light emitting device 2 for emitting electromagnetic radiation in the wavelength range of the light spectrum and a transducer device 3, located in an imaging room 5 (such as a room within a medical imaging suite housing an MRI or other imaging device), for transforming the electromagnetic radiation into electrical energy and directing the electrical energy to the device 10 so as to minimize interfering magnetic fields in the imaging room 5. In some embodiments, the transducer device 3 may comprise a photovoltaic element 16, including, but not limited to one or more solar cells, for transforming the electromagnetic radiation into electrical energy.

Furthermore, the transducer device 3 may also comprise electrical cables 8, 9 for directing the electrical energy to the device 10. In some embodiments, the transducer device 3 may be operably engaged with and/or in communication with the device 10 so as to minimize the physical distance between the transducer device 3 and the device 10 such that the potential interference produced by electrical cables 8, 9 may be minimized. Furthermore, in some embodiments, the electrical cables 8, 9 may be further shielded so as to minimize the interference effect generated by directing the electrical energy from the transducer device 3 to the device 10.

According to additional embodiments, as shown in FIG. 1, the transducer device 3 may further comprise a photovoltaic element 16 as well as a photodiode 17 that may be operably engaged, via a monitoring switching circuit 18, to a transducer controller 19. In some embodiments, the photovoltaic element 16 of the transducer device 3 may be configured to provide a supply of electrical energy of several hundred milliwatts up to a few watts. In some embodiments, the photovoltaic device 16 of the transducer device 3 may comprise doped silicon crystals for converting electromagnetic radiation into electrical energy. The photodiode 17 may be configured to detect the intensity and/or quality of the electromagnetic radiation reaching the photovoltaic element 16 and transmitting data corresponding to the intensity and/or quality to the transducer controller 19 (which may then communicate with the emitter controller 25 via, for example, the responder fiber-optic cable 23).

As shown in FIG. 2, certain components of the transducer device 3 may be connected using "sandwich" techniques for packaging electronic components wherein electrical connecting elements, carrying the optical device 22, photovoltaic element 16, and photodiode 17, for example, are placed in a "sandwich" structure 40 so as to minimize the distance between the sandwiched components, with a first metallic foil 31 (including, but not limited to: copper, copper-PCB layers, silver, gold, and/or other conductive metallic foils, for example) and a second metallic foil (including, but not limited to: copper, copper-PCB layers, silver, gold, and/or other conductive metallic foils, for example) disposed on at least one side of the sandwich structure 40. The metallic foils may be separated by an isolation layer 33 (comprising, for example, a thin layer of dielectric material). The first and second metallic foils 31, 32 may thus create an effective shield against the incursion of external EM fields into the sandwich structure 40 of the transducer device 3 and the leakage of internal EM fields generated by the various components of the transducer device 3. In some embodiments, as shown generally in FIG. 2, the photovoltaic element 16 is operably engaged, via a heat conducting element 34, to at least one of the two metallic foils 31, 32. In some embodiments, the metallic foils 31, 32 may extend to a distance exceeding 5 centimeters on all boundaries of a planar surface of the photovoltaic element 16 such that any heat generated when irradiating the photovoltaic element 16 with electromagnetic radiation (such as laser light generated by a lighting element 11 included in the light-emitting device 2) is conducted to the outer extents of the metallic foils 31, 32 (such as the "heat-sink" second metallic foil 32 shown generally in FIG. 2) such that the heat may be dissipated without adverse affect on the electronic components of the transducer device 3.

As described herein with respect to FIG. 1, the transducer device 3 is located in an imaging room 5 (such as an MRI room), in which the magnet tube of the MRI system, not shown here, is located. In some embodiments, the light emitting device 2 is located in a control room 4. The MR room is shown with an external shield 6 to protect against the incursion of externally-generated EM fields. According to some embodiments, the external shield 6 is disposed substantially between the control room 4 and the MR room 5 for shielding against EM fields emitted outside the Imaging room 5. The shield 6 may comprise, for example, a Faraday cage or other shielding device that will be appreciated by one skilled in the art. Because the electromagnetic radiation emitted by the light-emitting device 2 does not cause interfering electromagnetic fields that may affect the quality and/or operability of a medical diagnostic process (such as generating of an MRI scan), EM shielding about the electromagnetic energy pathway established between the light emitting device 2 and the transducer device 3 (see, for example, the transmitter fiber-optic cable 20, as described further herein) is not necessary even when the EM radiation transmits relatively large amounts of energy.

As shown in FIG. 1, the light emitting device 2 may comprise a lighting element 11 for generating electromagnetic radiation in the wavelength range of the light spectrum. Furthermore, the lighting element 11 may include various lighting devices that may include, but are not limited to: lamps (such as halogen and/or xenon lamps, for example), lasers, laser diodes, light-emitting diodes, diffuse lighting elements, and combinations of such devices. The light emitting device 2 may further comprise a driver 12 in communication with the lighting element 11 for controlling and/or energizing the lighting element 11. As described in further detail herein, the light emitting device 2 may also comprise, in some embodiments, a switching module circuit 13 and an emitter controller 25 (both of which may be in communication with the driver 12 and/or lighting element 11). The switching module circuit 13 may be configured to be capable of switching the driver 12 (and, in turn, the lighting element 11) on and off in response to feedback signals transmitted along a responder fiber optic cable 23 operably engaged between the light-emitting device 2 and the transducer device 3.

The light emitting device 2 may also be in communication with an energy source (not shown) via one or more cables 7. According to various embodiments, the energy source for the light emitting device 2 may include, but is not limited to: an alternating current source, a direct current source; and/or a battery.

The light-emitting device 2 (and the lighting element 11 included therein) may be configured to emit electromagnetic radiation in the wavelength range of the light spectrum. The electromagnetic radiation emitted by the light-emitting device 2 may include, but is not limited to: radiation within the visible light spectrum (i.e. substantially between about 400 and about 700 nm), radiation in the near infrared spectrum, radiation in the far infrared spectrum, radiation in the ultraviolet (UV) spectrum, and combinations of such radiation types. The limit of the feasible wavelength spectrum of the electromagnetic radiation emitted by the light-emitting device 2 may be defined by the capabilities of the transducer device 3 for transforming the electromagnetic radiation into electrical energy. For example, the spectrum of the electromagnetic radiation may be limited, in some embodiments, by the occurrence of the requisite photo-effect in the photovoltaic element 16 that, in some embodiments, comprises doped silicon crystals.

According to some embodiments of the present invention, the light emitting device 2 may be located outside of the imaging room 5 (such as, for example, in a control room 4, as shown schematically in FIG. 1). However, in some additional embodiments, the light emitting device 2 may be located within the imaging room 5. For example, in some embodiments, the light-emitting device 2 may comprise lighting elements present in an existing imaging room 5 (such as, for example standard halogen or filament lights installed and/or set up in the imaging room). According to some such embodiments, the corresponding transducer device 3 may comprise one or more solar cells configured to be capable of converting a diffuse visible light in the imaging room 5 into a photocurrent sufficient for the current requirements of the devices 10 present in the imaging room 5.

However, as shown in FIG. 1, it may be preferable that the light emitting device 2 is located outside the imaging room 5 such that the electromagnetic radiation emitted thereby is imported into the imaging room 5 through its shielding 6 without introducing potentially interfering EM fields into the imaging room 5. By positioning the light emitting device 2 outside the imaging room 5 (such as in an adjacent or non-adjacent control room 4 separated from the imaging room 5 by suitable EM shielding 6), EM fields that may be generated by the light-emitting device 2 (and/or cables 7 operably engaged therewith) may not affect the quality of the imagery produced by the imaging device (such as an MRI system). Furthermore, in embodiments where the light emitting device 2 is located outside of the shielding 6 of the imaging room 5, the strength of the light emitting device 2 (and the strength of EM fields generated thereby) may be increased such that the electromagnetic radiation emitted thereby is sufficient to generate requisite radiation intensity such that the transducer device 3 may supply corresponding electrical energy to one or more devices 10 within the imaging room 5.

In some embodiments, where the light-emitting device 2 is located outside the imaging room 5, the electromagnetic radiation emitted by the light emitting device 2 may be imported into the imaging room 5 (from, for example, an adjacent control room 4) via a viewing glass or other viewing port defined in the shielding 6 surrounding the imaging room 5. For example, the light emitting device 2 may be operably engaged with a viewing glass and/or with a window sill defined in a wall of a control room 4 such that electromagnetic radiation generated by the light-emitting device 2 may be transmitted through the window and into the imaging room 5 (with or without the use of a light-transmitting element (such as a transmitter fiber-optic cable 20, as described below) and supplied to the transducer device 3 (which, as described herein may comprise a solar cell or other photovoltaic element 16).

As shown in FIG. 1, the electromagnetic radiation generated by the light-emitting device 2 (and the lighting element 11 included therein) may be transmitted through the shielding 6 and into the imaging room 5 via a cable-formed light carrying element, such as a transmitter fiber-optic cable 20. The transmitter fiber-optic cable may comprise a commercially-available fiber-optic cable or "light pipe" that is low-loss and sufficiently proven and tested for everyday and substantially continuous use. Thus, in some embodiments of the system 1 of the present invention, multiple transmitter fiber optic cables 20 may be used to transmit electromagnetic radiation from one or more light emitting devices 2 (located outside the imaging room 5, for example) into the imaging room and to various devices 10 throughout the imaging room 5. In some such embodiments, each device 10 may be provided with a corresponding transducer device 3 for converting the electromagnetic radiation, transmitted by the transmitter fiber optic cable 20, into electrical energy that may be usable by the devices 10.

More particularly, in some embodiments, the light emitting device 2 may comprise a lighting element 11 (such as a laser device) located outside the shielding 6 of the imaging room 5. As described herein, the system 1 may further comprise a transmitter fiber-optic cable 20 including a first end operably engaged with an outlet of the lighting element 11 (via a connecting element 21, for example) and a second end operably engaged with the transducer device 3 via an optical connecting element 22.

The use of a laser device (such as a laser diode) as the lighting element 11 may be suitable for the high energy transfer of photons. However, as one skilled in the art will appreciate, the overall quality of the photon stream (i.e. the electromagnetic radiation in the visible light spectrum) may not be crucial for the effective generation of electrical energy at the transducer device 3. Thus, in some embodiments, the lighting element 11 of the light emitting device 2 may comprise a reliable, high-performance laser device as the source of the electromagnetic radiation. Because the laser device power characteristics are generally more important to the operation of the system 1 than the downstream optical characteristics of the electromagnetic radiation, the system 1 of the present invention may be assembled with relatively low-cost optical components (21, 22) compared to laser systems requiring high-grade optical characteristics.

In some embodiments, increased reliability and efficiency may be achieved wherein the optical coupling element 22 is shaped to collect the electromagnetic radiation transmitted via the transmitter fiber-optic cable 20. For example, as indicated herein, the optical coupling element 22 may be operably engaged between the transmitting fiber-optic cable 20 and the light incidence area of the photovoltaic element 16. The optical coupling element 22 may be further formed to the contour of the light incidence area of the photovoltaic element 16. In some embodiments, the optical coupling element 22 may be formed as a pyramid or bell-shaped form for dispersing the electromagnetic radiation over the light-incidence area of the photovoltaic element 16 to ensure that the various cells of the photovoltaic element 16 are evenly illuminated by the electromagnetic radiation transmitted via the transmitting fiber-optic cable 20.

An example of a system 1 according to one embodiment of the present invention is shown in FIG. 1, wherein the light emitting device 2 and the transducer device 3 are fiber-optically connected by the transmitter fiber optic cable 20 such that one end of the transmitter fiber optic cable 20 connected to the lighting element 11 (such as a laser diode) via a connecting device 21. An opposite end of the transmitter fiber optic cable 20 is farther connected, via an optical coupling element 22, (such as a laserdom) to the photovoltaic element 16.

Some embodiments may further comprise a responder fiber-optic cable 23 operably engaged between the light-emitting device 2 and the transducer device 3. The responder fiber optic cable 23 may be configured to be capable of transmitting data concerning the monitoring switching circuit 18 to the switching module circuit 13. For example, the transducer device 3 may, in some embodiments, comprise a photodiode 17 in communication with the monitoring switching circuit 18 for monitoring the energy transferred from the light-emitting device 2 to the transducer device 3 via the transmitter fiber-optic cable 20. The energy levels detected and monitored by the photodiode 17 and the monitoring switching circuit 18, respectively, may be indicative of the integrity and/or efficiency of the transmitter fiber-optic cable 20. For example, the feedback path established by the responder fiber optic-cable 23 may be used to detect and report potential fiber breaks to the light emitting device 2 such that if such a break is detected, the light-emitting device 2 may be shut down and/or attenuated in order to prevent the leakage of potentially damaging light radiation from the broken fibers within the transmitter fiber-optic cable 20. Therefore, in some such embodiments, the monitoring switching circuit 18 may send a response signal (via the responder fiber-optic cable 23, for example) in real-time to the switching module circuit 13 of the light-emitting device 2. In response, the switching module circuit 13 of the light-emitting device 2 may control the driver 12 to adjust the intensity, power, or other characteristic of the electromagnetic radiation generated by the lighting element 11 in response to the data received from the photodiode 17 of the transducer device 3.

In other embodiments, a controller fiber-optic cable 24 may also be operably engaged between the light-emitting device 2 and the transducer device 3. The controller fiber-optic cable 24 may, in some embodiments, establish communication between the control unit 19 of the transducer device 3 with a control unit 25 of the light-emitting device 2 and enable a transmission of data from the light-emitting device 2 to the transducer device 3, wherein the data may include, but is not limited to: an indication of the position of the switch-module circuit 13; a status of the transmitter fiber-optic cable 20; a selection of a level of electrical energy required by one or more devices 10 within the imaging room 5; a selection of a number of devices 10 in communication with the transducer device 3 (via, for example, the electrical cables 8, 9); and combinations of such data. In some embodiments, the controller fiber-optic cable 24 may be in bi-directional communication with at least one of the control components 19, 25 and the switch module-circuit 13 such that the control components may monitor the light emitting device 2 for a "switched off" condition wherein the lighting element 11 is turned off or otherwise fails to supply an adequate stream of electromagnetic radiation to the transducer device 3. As shown in FIG. 1, in some embodiments, the controller fiber-optic cable 24 may also extend between the control components 19, 25 of the light-emitting device 2 and transducer device 3 and the device 10 such that the status, power consumption level, voltage demands, or other operating characteristic of the device 10 may be taken into account when controlling at least one of the light emitting device 2 and the transducer device 3 of the system 1 of the present invention.

The transmitter fiber optic cable 20 may also be configured to be capable of transmitting a data stream in addition to the electromagnetic radiation generated by the light-emitting device 2 such that the responder fiber-optic cable 23 and the controller fiber-optic cable 24 may be replaced by a single transmitter fiber-optic cable 20. According to some embodiments, the transmitter fiber-optic cable 20, responder fiber optic cable 23, and/or the controller fiber-optic cable 24 may be configured to be capable of transmitting information via a bi-directional connection established between the light-emitting device 2 and the transducer device 3. As described herein, because the data streams and electromagnetic radiation are transmitted via fiber-optic cables, the connections (established by the fiber-optic cables 20, 23, 24) established between the light-emitting device 2 and the transducer device 3 have no effect on any electrical or EM fields within the imaging room 5. Furthermore, such fiber optic cables 20, 23, 24 are also substantially resistant to interference from electrical or EM fields within the imaging room 5 (such as the very powerful EM fields generated by an MRI imaging system).

Regardless of the communication pathway established between the light-emitting device 2 and the transducer device 3, various embodiments of the present invention may enable the control, management, and/or regulation of the performance of the lighting element 11 (such as a laser diode) of the light-emitting device 2. For example, the data transmitted via at least one of the transmitter fiber-optic cable 20, the responder fiber-optic cable 23 and/or the controller fiber-optic cable 24 may provide control inputs to at least one of the control component 25, the switching module circuit 13, and the driver 12 of the light emitting device 2 such that the lighting element 11 therein produces an appropriate amount of energy required to provide electrical energy to one or more devices 10 that may be in communication with the transducer device 3. The various control and feedback elements of the system 1 may thus: reduce energy loss; increase the operational life of the optical elements (such as the transmitter fiber-optic cable 20, the optical coupling element 22, the connecting device 21); and increase the operational life of the lighting element 11. For example, in embodiments wherein the lighting element 11 of the light-emitting device 2 is a laser diode, the feedback data transferred from the monitoring switch circuit 18 of the transducer device 3 to the switching module circuit 13 of the light-emitting device 2 (see FIG. 1) may include an indication to operate the lighting element 11 in a life-prolonging partial operational mode.

Furthermore, in some embodiments, the transducer device 3 may further comprise an energy storage device 26 (such as a battery or capacitor, for example) for storing electrical energy generated by the photovoltaic element 16 of the transducer device 3 during operational cycles wherein the electrical energy required by the device 10 does not reach the level of electrical energy produced by the photovoltaic element 11. Thus, during load peaks or "spikes" (wherein the device 10 requires more electrical energy than is immediately made available by the photovoltaic element 16), the control component 19 of the transducer device may bring the energy storage device 26 online to provide electrical energy to supplement the electrical energy provided by the photovoltaic element 16.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Although specific terms are employed herein, they are used in a generic and descriptive sense only and not for purposes of limitation.

That which is claimed:

1. A system for providing electrical energy to a device used in connection with an imaging room, the room having shielding against electromagnetic fields, the system comprising:
    an electromagnetic radiation emitting component for emitting electromagnetic radiation; and
    a transducer located in the room for detecting the electromagnetic radiation, transforming the electromagnetic radiation into electrical energy, and directing the electrical energy to the device used in connection with the imaging room so as to supply power to the device and to minimize interfering magnetic fields in the room, the transducer comprising
    an optical connecting element for collecting the electromagnetic radiation,
    a photovoltaic element for transforming the electromagnetic radiation into electrical energy,
    a photodiode,
    a transducer controller,
    a monitoring switch circuit,
    wherein the photodiode operably connected with the photovoltaic element for monitoring a characteristic of the electromagnetic radiation and transmitting data corresponding to the monitored characteristic of the electromagnetic radiation to the transducer controller,
    wherein the photovoltaic element and the photodiode operably connected to the transducer controller via the monitoring switching circuit,
    wherein at least one control signal is transmitted from the transducer to the electromagnetic radiation emitting component, the at least one control signal partially based on detection of the electromagnetic radiation or operating characteristics of the device used in connection with the imaging room, and
    wherein the data corresponding to the characteristic of the electromagnetic radiation and the at least one control signal for controlling the electromagnetic radiation emitting component are transmitted from the transducer to the the electromagnetic radiation emitting component.

2. A system in accordance with claim 1, wherein the electromagnetic radiation emitting component comprises a laser diode.

3. A system in accordance with claim 1, wherein the electromagnetic radiation emitting component is configured to be capable of emitting electromagnetic radiation having a wave length substantially between about 400 nanometers and about 700 nanometers.

4. A system in accordance with claim 1, wherein the electromagnetic radiation emitting component is configured to be capable of emitting electromagnetic radiation having a wave length substantially within the near infrared light spectrum.

5. A system in accordance with claim 1, wherein the electromagnetic radiation emitting component is configured to be capable of emitting electromagnetic radiation having a wave length substantially within the far infrared light spectrum.

6. A system in accordance with claim 1, wherein the electromagnetic radiation emitting component is configured to be capable of emitting electromagnetic radiation having a wave length substantially within the ultraviolet light spectrum.

7. A system in accordance with claim 1, wherein the imaging room comprises a magnetic resonance imaging (MRI) suite.

8. A system in accordance with claim 1, further comprising a transmitter fiber optic cable including a first end operably engaged with the electromagnetic radiation emitting component and a second end operably engaged with the transducer for transmitting the electromagnetic radiation to the transducer.

9. A system in accordance with claim 8, wherein the second end of the transmitter fiber-optic cable is operably engaged with the device comprising the transducer via an optical connecting element.

10. A system in accordance with claim 8, wherein the transmitter fiber optic capable is configured to be capable of transmitting a data stream including data for controlling the electromagnetic radiation emitting component.

11. A system in accordance with claim 1, wherein the photovoltaic element is selected from the group consisting of: an array of doped silicon crystals; at least one solar cell; and combinations thereof.

12. A system in accordance with claim 1, wherein the photovoltaic element is operably engaged with a planar metallic element via a heat conducting element, the planar metallic element extending beyond a planar area of the photovoltaic element so as to dissipate heat generated by the photovoltaic element when transforming the electromagnetic energy into electrical energy.

13. A system in accordance with claim 12, wherein the planar metallic element comprises a copper foil.

14. A system in accordance with claim 12, wherein the planar metallic element comprises a silver foil.

15. A system in accordance with claim 12, wherein the planar metallic element comprises a gold foil.

16. A system in accordance with claim 1 further comprising a controller fiber-optic cable operably engaged between the transducer and the electromagnetic radiation emitting component for transmitting a first control signal from the transducer to the electromagnetic radiation emitting component such that the electromagnetic radiation emitting component is at least partially controllable from inside the room.

17. A system in accordance with claim 16, further comprising a responder fiber-optic cable operably engaged between the transducer and the electromagnetic radiation emitting component for transmitting information corresponding to the characteristic of the electromagnetic radiation.

18. A system in accordance with claim 17, wherein a second control signal is transmitted from the transducer to the electromagnetic radiation emitting component via the responder fiber-optic cable, wherein the second control signal comprises an instruction to reduce an intensity of the emitted electromagnetic radiation when the transmission information indicates that the transmitter fiberoptic cable is compromised.

* * * * *